(12) United States Patent
Nishimura et al.

(10) Patent No.: US 9,172,350 B2
(45) Date of Patent: Oct. 27, 2015

(54) ELASTIC WAVE APPARATUS

(75) Inventors: Kazunori Nishimura, Kyoto (JP);
Satoru Ikeuchi, Hyogo (JP)

(73) Assignee: SKYWORKS PANASONIC FILTER SOLUTIONS JAPAN CO., LTD., Kadoma-Shi (JP)

(*) Notice: Subject to any disclaimer, the term of this patent is extended or adjusted under 35 U.S.C. 154(b) by 501 days.

(21) Appl. No.: 13/701,417

(22) PCT Filed: Mar. 7, 2012

(86) PCT No.: PCT/JP2012/001546
§ 371 (c)(1),
(2), (4) Date: Nov. 30, 2012

(87) PCT Pub. No.: WO2012/120879
PCT Pub. Date: Sep. 13, 2012

(65) Prior Publication Data
US 2013/0141189 A1    Jun. 6, 2013

(30) Foreign Application Priority Data

Mar. 9, 2011    (JP) .................................. 2011-051192

(51) Int. Cl.
*H03H 9/64* (2006.01)
*H03H 9/00* (2006.01)
H03H 9/72 (2006.01)
H03H 9/54 (2006.01)

(52) U.S. Cl.
CPC ............... *H03H 9/0028* (2013.01); *H03H 9/64* (2013.01); *H03H 9/0038* (2013.01); *H03H 9/0071* (2013.01); *H03H 9/0085* (2013.01); *H03H 9/54* (2013.01); *H03H 9/725* (2013.01)

(58) Field of Classification Search
CPC ... H03H 9/725; H03H 9/0028; H03H 9/0038; H03H 9/0071; H03H 9/0085; H03H 9/54; H03H 9/64

USPC ..... 333/25, 133, 193–196; 310/313 B, 313 D
See application file for complete search history.

(56) References Cited

U.S. PATENT DOCUMENTS

| | | | |
|---|---|---|---|
| 2007/0103254 A1 | 5/2007 | Haruta et al. | |
| 2009/0153269 A1 | 6/2009 | Ono et al. | |
| 2009/0273409 A1 | 11/2009 | Okuda | |
| 2011/0006855 A1 | 1/2011 | Fujiwara et al. | |

FOREIGN PATENT DOCUMENTS

| | | |
|---|---|---|
| JP | 2009-147740 A | 7/2009 |
| WO | WO-2006/003787 A1 | 1/2006 |
| WO | WO-2008/096514 A1 | 8/2008 |
| WO | WO-2009/113274 A1 | 9/2009 |

OTHER PUBLICATIONS

International Search Report issued in International Patent Application No. PCT/JP2012/001546 dated Apr. 24, 2012.

*Primary Examiner* — Benny Lee
*Assistant Examiner* — Jorge Salazar, Jr.
(74) *Attorney, Agent, or Firm* — Lando & Anastasi, LLP

(57) ABSTRACT

An elastic wave device includes a first unbalanced terminal, a second unbalanced terminal, a first balanced terminal, a second balanced terminal, a first filter part, and a second filter part. A phase of an electric signal transmitted from first unbalanced terminal to the first balanced terminal in the first filter part is different from a phase of an electric signal transmitted from the second unbalanced terminal to the first balanced terminal in the second filter part. A phase of an electric signal transmitted from the first unbalanced terminal to the second balanced terminal in the first filter part is different from a phase of an electric signal transmitted from the second unbalanced terminal to the second balanced terminal in the second filter part.

30 Claims, 6 Drawing Sheets

ELASTIC WAVE APPARATUS

TECHNICAL FIELD

The present invention relates to an elastic wave device having an unbalance/balance conversion function.

BACKGROUND ART

Recently, an elastic wave device including a plurality of high-frequency filters having different passbands has been used in, for example, a portable telephone. Filters whose frequency bands are near each other, for example, a filter having a passband of 1805 to 1880 MHz and a filter having a passband of 1930 to 1990 MHz are used. In such a case, a dual filter is used, which has a structure in which a balanced terminal is shared in order to share a circuit other than filters.

FIG. 6 is a schematic plan view of a conventional elastic wave device 101. Elastic wave device 101 includes low band side filter 103 and high band side filter 104 on piezoelectric substrate 2 made of piezoelectric single crystal. Low band side filter 103 is an unbalance/balance conversion type filter having passing characteristics in a band whose center frequency is relatively low. High band side filter 104 is an unbalance/balance conversion type filter having passing characteristics in a band whose center frequency is relatively high. Low band side filter 103 is connected to unbalanced terminal 5 at an input side. High band side filter 104 is connected to unbalanced terminal 6 at an input side. Furthermore, low band side filter 103 and high band side filter 104 are connected and shared to balanced terminal 7 and balanced terminal 8 at the output side.

Low band side filter 103 has longitudinally coupled elastic wave filters (longitudinally coupled elastic wave resonators) 51 and 52. High band side filter 104 has longitudinally coupled elastic wave filters 53 and 54.

Longitudinally coupled elastic wave filter 51 includes IDTs (Inter Digital Transducers) 51a, 51b, and 51c. Longitudinally coupled elastic wave filter 52 includes IDTs 52a, 52b, and 52c. Longitudinally coupled elastic wave filter 53 includes IDTs 53a, 53b, and 53c. Longitudinally coupled elastic wave filter 54 includes IDT 54a, 54b, and 54c.

Phases of IDT 51a, IDT 51b, and IDT 51c of low band side filter 103 are the same as those of IDT 53a, IDT 53b, and IDT 53c of high band side filter 104. Furthermore, phases of IDT 52a, IDT 52b, and IDT 52c of low band side filter 103 are the same as those of IDT 54a, IDT 54b, and IDT 54c of high band side filter 104 (for example, PTL 1).

CITATION LIST

Patent Literature

PTL 1: International Publication No. 08/096514

SUMMARY OF THE INVENTION

An elastic wave device includes a first unbalanced terminal, a second unbalanced terminal, a first balanced terminal, a second balanced terminal, a first filter part, and a second filter part. The first filter part has a first passband, is electrically connected to the first unbalanced terminal at an input side, is electrically connected to the first balanced terminal and the second balanced terminal at an output side, and has an unbalance/balance conversion function. The second filter part has a second passband whose frequency is higher than that of the first passband, is electrically connected to the second unbalanced terminal at an input side, is electrically connected to the first balanced terminal and the second balanced terminal at an output side, and has an unbalance/balance conversion function.

A phase of an electric signal transmitted from the first unbalanced terminal to the first balanced terminal in the first filter part, and a phase from the second unbalanced terminal to the first balanced terminal in the second filter part are different from each other such that they are opposite phases to each other. A phase from the first unbalanced terminal to the second balanced terminal in the first filter part and a phase from the second unbalanced terminal to the second balanced terminal in the second filter part are different from each other such that they are opposite phases to each other.

DESCRIPTION OF EMBODIMENTS

Figure 1:
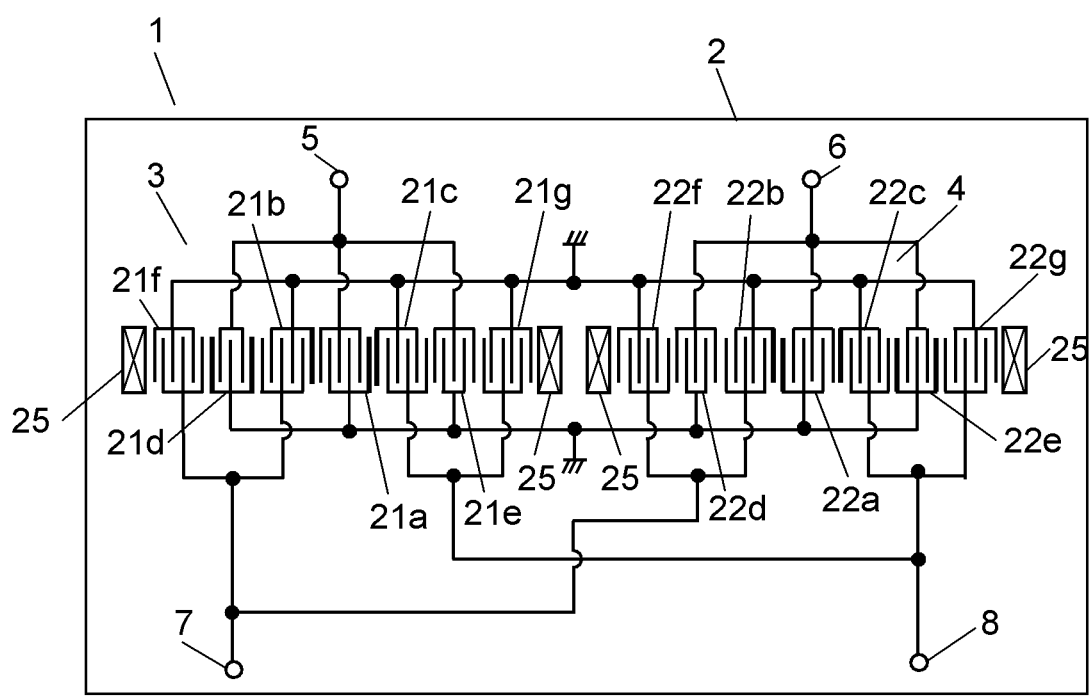
FIG. 1 is a schematic plan view of an elastic wave device according to a first exemplary embodiment of the present invention.

Recently, in a communication device using such an elastic wave device 101, an electronic circuit (not shown) connected to balanced terminals 7 and 8 has tended to be shared, thus reducing the size and cost. Also in elastic wave device 101, it is required that balanced terminals 7 and 8 connected to low band side filter 3 and balanced terminals 7 and 8 connected to high band side filter 104 be shared. However, when balanced terminals 7 and 8 are shared, a signal may be mixed into low band side filter 103 or high band side filter 104 from the other filter. In order to prevent a signal from mixing, it is necessary to secure isolation between low band side filter 103 and high band side filter 104, and it is necessary to sufficiently secure an attenuation amount in the passband of a filter of each counterpart. Herein, the counterpart is high band side filter 104 for low band side filter 103, and is low band side filter 103 for high band side filter 104. In detail, in low band side filter 103, it is necessary to secure an excellent attenuation amount in the frequency corresponding to the passband of high band side filter 104; in high band side filter 104, it is necessary to secure an excellent attenuation amount in the frequency corresponding to the passband of low band side filter 103.

First Exemplary Embodiment

FIG. 1 is a schematic plan view of elastic wave device 1 according to a first exemplary embodiment of the present invention. Elastic wave device 1 includes a first filter part (a low band side filter) and a second filter part (a high band side filter) on piezoelectric substrate 2. As the first filter part, first elastic wave filter 3 having a first passband is formed. As the second filter part, second elastic wave filter 4 having a second passband whose center frequency is higher than that of the first passband is formed.

Elastic wave device 1 includes first unbalanced terminal 5 connected to first elastic wave filter 3, second unbalanced terminal 6 connected to second elastic wave filter 4, as well as first balanced terminal 7 and second balanced terminal 8 connected to both first elastic wave filter 3 and second elastic wave filter 4.

First elastic wave filter 3 is a longitudinally coupled elastic wave resonator, and includes IDTs (Inter Digital Transducers) 21a, 21b, 21c, 21d, 21e, 21f, and 21g. In IDT 21a, IDT 21d, and IDT 21e, one of opposing comb electrodes is connected to first unbalanced terminal 5, and the other is connected to ground. In IDT 21b and IDT 21f, one of opposing comb electrodes is connected to balanced terminal 7, and the other is connected to ground. In IDT 21c and IDT 21g, one of opposing comb electrodes is connected to balanced terminal 8, and the other is connected to ground. In addition, two reflectors 25 sandwich IDT 21a, IDT 21b, IDT 21c, IDT 21d, IDT 21e, IDT 21f, and IDT 21g.

Second elastic wave filter 4 is a longitudinally coupled elastic wave resonator, and includes IDTs 22a, 22b, 22c, 22d, 22e, 22f, and 22g. In IDT 22a, IDT 22d, and IDT 22e, one of opposing comb electrodes is connected to first unbalanced terminal 6, and the other is connected to ground. In IDT 22b and IDT 22f, one of opposing comb electrodes is connected to balanced terminal 7, and the other is connected to ground. In IDT 22c and IDT 22g, one of opposing comb electrodes is connected to balanced terminal 8, and the other is connected to ground. In addition, two reflectors 25 sandwich IDTs 22a, 22b, 22c, 22d, 22e, 22f, and 22g.

Furthermore, a case in which one of the adjacent comb electrodes in two adjacent IDTs is a comb electrode connected to a signal line and the other is a comb electrode connected to ground is defined as normal phase connection. Furthermore, a case in which both of the adjacent comb electrodes in two adjacent IDTs are comb electrodes connected to a signal line or the both are comb electrodes connected to ground is defined as reversed phase connection.

According to this definition, in first elastic wave filter 3, the phase relation between IDT 21a and IDT 21b, the phase relation between IDT 21d and IDT 21b, and the phase relation between IDT 21d and IDT 21f are in normal phase connection. On the other hand, the phase relation between IDT 21a and IDT 21c, the phase relation between IDT 21e and IDT 21c, and the phase relation between IDT 21e and IDT 21g are in reversed phase connection. Therefore, a phase of an electric signal transmitted from unbalanced terminal 5 to balanced terminal 7 and a phase of an electric signal transmitted from unbalanced terminal 5 to balanced terminal 8 are opposite to each other, so that first elastic wave filter 3 carries out an unbalance-balance operation.

Furthermore, in second elastic wave filter 4, the phase relation between IDT 22a and IDT 22b, the phase relation between IDT 22d and IDT 22b, and the phase relation between IDT 22d and IDT 22f are in reversed phase connection. On the other hand, the phase relation between IDT 22a and IDT 22c, the phase relation between IDT 22e and IDT 22c, and the phase relation between IDT 22e and IDT 22g are in normal phase connection. Therefore, a phase of an electric signal transmitted from unbalanced terminal 6 to balanced terminal 7 and a phase of an electric signal transmitted from unbalanced terminal 6 to balanced terminal 8 are opposite to each other, so that second elastic wave filter 4 carries out an unbalance-balance operation.

Furthermore, a transfer route from unbalanced terminal 5 to balanced terminal 7 in first elastic wave filter 3 is normal phase connection, while a transfer route from unbalanced terminal 6 to balanced terminal 7 in second elastic wave filter 4 is reversed phase connection. Furthermore, a transfer route from unbalanced terminal 5 to balanced terminal 8 in first elastic wave filter 3 is reversed phase connection, while a transfer route from unbalanced terminal 6 to balanced terminal 8 in second elastic wave filter 4 is normal phase connection. In this way, when two filters are connected to a common balanced terminal in a reversed phase relation, if first elastic wave filter 3 and second elastic wave filter 4 have the same passband frequency, electric signals are mutually cancelled. Consequently, they do not operate as a filter. However, when first elastic wave filter 3 and second elastic wave filter 4 have different passband frequencies, they not only operate as a filter, they but also improve an attenuation amount in the frequencies corresponding to the passband frequencies of the respective counterparts. Herein, the counterpart is a high band side filter for a low band side filter, and is a low band side filter for a high band side filter. In more detail, it is possible to obtain filter characteristics of the low pass side in which the insertion loss at the first passband (low band side) is small and which is excellent in the attenuation amount of a frequency corresponding to the second passband (high band side). Furthermore, it is possible to obtain filter characteristics of the high band side in which the insertion loss of the second passband is small and which is excellent in the attenuation amount of the frequency corresponding to the first passband. Since the attenuation amount is improved, isolation characteristics between the first passband frequency and the second passband frequency become excellent.

Hereinafter, other effects when first elastic wave filter 3 and second elastic wave filter 4 are shared and connected to a balanced terminal such that they are in a reversed phase relation are described. Herein, an IDT connected to the input side (first unbalanced terminal 5 side or second unbalanced terminal 6 side) is referred to as an input IDT, and an IDT connected to the output side (first balanced terminal 7 side or second balanced terminal 8 side) is referred to as an output IDT. In FIG. 1, the number of comb electrodes connected to ground in comb electrodes in a place in which the input IDT and the output IDT are adjacent to each other is described below. The total of a number of the comb electrodes connected to ground that exists in a route from unbalanced terminal 5 to balanced terminal 7 and a route from unbalanced terminal 6 to balanced terminal 7 and the total of a number of comb electrodes connected to ground that exists in a route from unbalanced terminal 5 to balanced terminal 8 and a route from unbalanced terminal 6 to balanced terminal 8 are equal to each other. In detail, the comb electrodes connected to ground that exists in the route from unbalanced terminal 5 to balanced terminal 7 and the route from unbalanced terminal 6 to balanced terminal 7 include five comb electrodes in total, including one comb electrode between IDT 21d and IDT 21f, one comb electrode between IDT 21d and IDT 21b, one comb electrode between IDT 21a and IDT 21b, and two comb electrodes between IDT 22b and IDT 22a. Furthermore, the comb electrodes connected to ground that exists in the route from unbalanced terminal 5 to balanced terminal 8 and in the route from unbalanced terminal 6 to balanced terminal 8 include five comb electrodes in total, including two comb electrodes between IDT 21a and IDT 21c, one comb electrode between IDT 22a and IDT 22c, one comb electrode between IDT 22e and IDT 22c, and one comb electrode between IDT 22e and IDT 22g. In FIG. 1, the above-mentioned comb electrodes are shown by a solid line.

With this configuration, parasitic capacitance generated among IDTs in the filter part, which is generated among first balanced terminal 7, first unbalanced terminal 5 and second unbalanced terminal 6, and parasitic capacitance among IDTs in the filter part, which is generated among second balanced terminal 8, first unbalanced terminal 5 and second unbalanced terminal 6 are substantially the same as each other. In addition, an average of a distance between the centers of the input IDT and the output IDT is the same in the route from first balanced terminal 7 to first unbalanced terminal 5 and second unbalanced terminal 6 and in the route from second balanced terminal 8 to first unbalanced terminal 5 and second unbalanced terminal 6. Consequently, an excellent degree of balance required for a filter having an unbalance-balance function can be achieved. As characteristics of the degree of balance, it is desired that difference between the transmission characteristics from the unbalanced terminal to the first balanced terminal and the transmission characteristics from the unbalanced terminal to the first balanced terminal be not more than 1 dB for amplitude and within 180°±10° for phase in the passband frequency. Meanwhile, in the above-mentioned configuration, the amplitude can be made to be not more than 0.6 dB, and the phase can be made within 180°±6°.

In addition, it is more preferable that the first filter part and the second filter part are a longitudinally coupled elastic wave resonator having seven IDTs. Parasitic capacitance may be generated in IDTs of the first filter part in a signal transfer route from first balanced terminal 7 to first unbalanced terminal 5 and second unbalanced terminal 6. Furthermore, parasitic capacitance may be generated in IDTs of the filter part in a transfer route from a terminal of second balanced terminal 8 to first unbalanced terminal 5 and second unbalanced terminal 6. In this configuration, such parasitic capacitance can be made to be substantially the same. Consequently, the insertion loss in the passband can be reduced, and an attenuation amount in a passband frequency band of the counterpart can be improved while the degree of balance is kept excellent. Therefore, elastic wave device 1 having excellent isolation can be obtained. Elastic wave device 1 in which the first elastic wave filter is DCS (passband frequency: 1805 to 1880 MHz) and the second elastic wave filter is PCS (passband frequency: 1930 to 1990 MHz) can be produced by the following specifications.

(First Elastic Wave Filter 3)

The number of comb electrodes of IDT 21f/IDT 21d/IDT 21b/IDT 21a/IDT 21c/IDT 21e/IDT 21g: 56/39/58/36/58/39/56

Electrode finger intersection width: 55.3 μm

Duty ratio: 0.55

Electrode thickness: 160 nm

The number of electrodes of reflector 25: 30 electrodes (Second Elastic Wave Filter 4)

The number of comb electrodes of IDT 22f/IDT 22d/IDT 22b/IDT 22a/IDT 22c/IDT 22e/IDT 22g: 30/63/34/32/34/63/30

Electrode finger intersection width: 35.0 μm

Duty ratio: 0.55

Electrode thickness: 160 nm

The number of electrodes of reflector 25: 50 electrodes

In FIG. 1, IDT 21f and IDT 21g have the same number of comb electrodes, and IDT 22f and IDT 22g have the same number of comb electrodes. However, the degree of balance may be deteriorated due to influences of parasitic impedance of wiring on an elastic wave element, and parasitic impedance of the wiring in a package. Therefore, in order to improve the degree of balance, by changing at least one of the number of the comb electrodes of IDT 21f and the number of the comb electrode of IDT 21g, the degree of balance may be improved. Furthermore, by changing at least one of the number of the comb electrodes of IDT 21f and the number of the comb electrodes of IDT 21g, the degree of balance may be improved. Alternatively, by changing at least one of the numbers of the comb electrodes of IDT 21f, IDT 21g, IDT 22f, and IDT 22g, the degree of balance may be improved. At this time, one comb electrode may be added or one comb electrode may be removed at the side near reflector 25. Thus, the degree of balance can be improved.

Alternatively, the number of the comb electrodes of IDT 21d of first elastic wave filter 3 and the number of the comb electrodes of IDT 22d of first elastic wave filter 3 may be allowed to be different from each other by one electrode, or the number of the comb electrodes of IDT 21b of first elastic wave filter 3 and the number of the comb electrodes of IDT 22b of first elastic wave filter 3 may be different from each other by one electrode. Also in this case, the degree of balance can be improved.

When the number of the comb electrodes of IDT 21d of first elastic wave filter 3 and the number of the comb electrodes of IDT 22d of second elastic wave filter 4 are allowed to be different from each other by one electrode, for example, one more comb electrode IDT 22d is disposed at the side nearer to reflector 25. In this case, it is necessary to reverse the polarity of IDT 21f that is adjacent to IDT 21d.

Furthermore, the number of the comb electrodes of IDT 21e of first elastic wave filter 3 and the number of the comb electrodes of IDT 22e of second elastic wave filter 4 may be allowed to be different from each other by one electrode. Furthermore, the number of comb electrodes of IDT 21c of first elastic wave filter 3 and the number of comb electrodes of IDT 22c of second elastic wave filter 4 may be allowed to be different from each other by one electrode. Thus, the degree of balance can be improved.

In elastic wave device 1, an inductor (not shown) as an external circuit may be used between first balanced terminal 7 and second balanced terminal 8. When an inductor is used, matching is improved, the voltage standing wave ratio (VSWR) is small such as not more than 2, and the insertion loss is reduced.

Second Exemplary Embodiment

Figure 2:
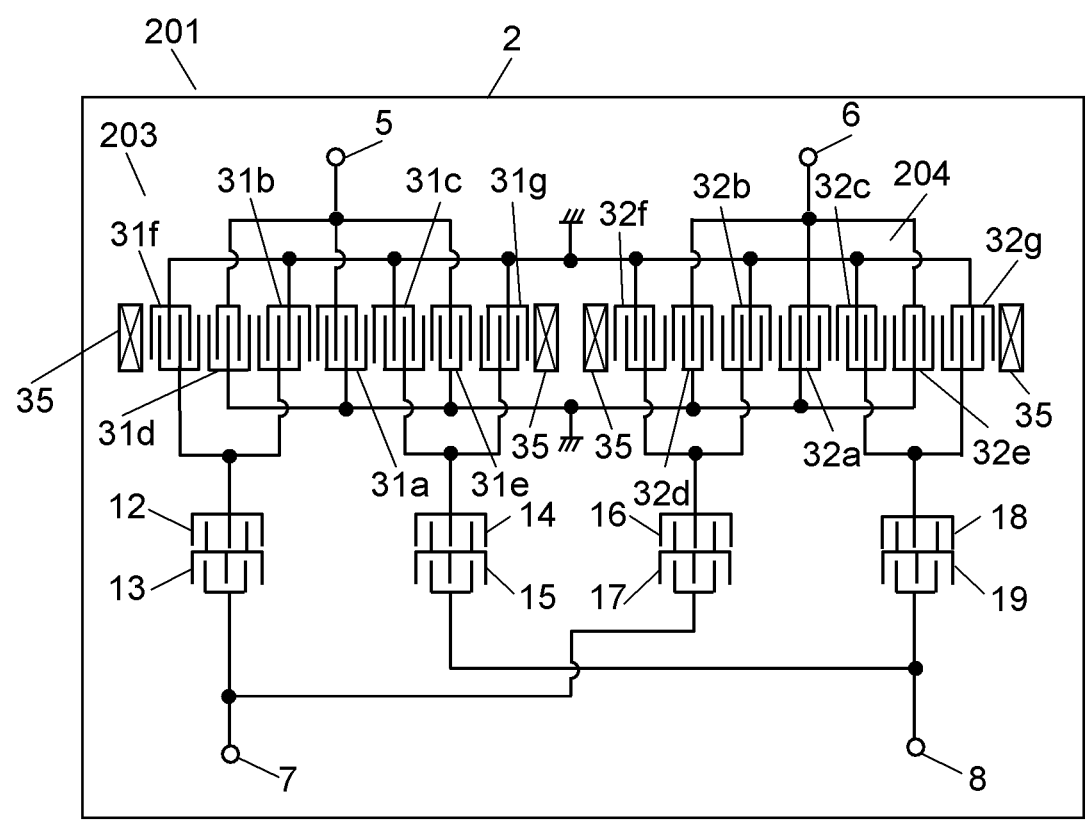
FIG. 2 is a schematic plan view of an elastic wave device according to a second exemplary embodiment of the present invention.

FIG. 2 is a schematic plan view of elastic wave device 201 according to a second exemplary embodiment of the present invention. Elastic wave device 201 includes first elastic wave filter 203 (a first filter part) having a first passband whose center frequency is relatively low and second elastic wave filter 204 (a second filter part) having a second passband whose center frequency is relatively high on piezoelectric substrate 2.

This exemplary embodiment is different from the first exemplary embodiment mainly in that one-terminal-pair elastic wave resonators 12 to 19 are connected at an output side of first elastic wave filter 203 or second elastic wave filter 204. In this exemplary embodiment, one-terminal-pair elastic wave resonators 12 to 19 are connected at an output side, but they may be connected at an input side.

Elastic wave device 201 includes first unbalanced terminal 5 connected to first elastic wave filter 203, second unbalanced terminal 6 connected to second elastic wave filter 204, and first balanced terminal 7 and second balanced terminal 8 connected to both first elastic wave filter 203 and second elastic wave filter 204. First one-terminal-pair elastic wave resonators 12 and 13 are electrically connected in series between first elastic wave filter 203 and first balanced terminal 7, and second one-terminal-pair elastic wave resonators 14 and 15 are electrically connected in series between first elastic wave filter 203 and second balanced terminal 8. Third one-terminal-pair elastic wave resonators 16 and 17 are connected between second elastic wave filter 204 and first balanced terminal 7, and fourth one-terminal-pair elastic wave resonators 18 and 19 are connected between second elastic wave filter 204 and second balanced terminal 8.

First elastic wave filter 203 is a longitudinally coupled elastic wave resonator including IDT 31a, IDT 31b, IDT 31c, DT 31d, IDT 31e, IDT 31f, and IDT 31g. In IDT 31a, IDT 31d, and IDT 31e, one of opposing comb electrodes is connected to first unbalanced terminal 5, and the other of the opposing comb electrodes is connected to ground. In IDT 31b and IDT 31f, one of opposing comb electrodes is connected to balanced terminal 7, and the other of the opposing comb electrodes is connected to ground. In IDT 31c and IDT 31g, one of opposing comb electrodes is connected to balanced terminal 8, and the other of the opposing comb electrodes is connected to ground. In addition, two reflectors 35 sandwich IDT 31a, IDT 31b, IDT 31c, IDT 31d, IDT 31e, IDT 31f, and IDT 31g.

Second elastic wave filter 204 is a longitudinally coupled elastic wave resonator including IDT 32a, IDT 32b, IDT 32c, DT 32d, IDT 32e, IDT 32f, and IDT 32g. In IDT 32a, IDT 32d, and IDT 32e, one of opposing comb electrodes is connected to first unbalanced terminal 6, and the other of the opposing comb electrodes is connected to ground. In IDT 32b and IDT 32f, one of opposing comb electrodes is connected to balanced terminal 7, and the other of the opposing comb electrodes is connected to ground. In IDT 32c and IDT 32g, one of opposing comb electrodes is connected to balanced terminal 8, and the other of the opposing comb electrodes is connected to ground. In addition, two reflectors 35 sandwich IDTs 32a, 32b, 32c, 32d, 32e, 32f, and 32g. Elastic wave device 201 in which first elastic wave filter 203 is DCS (passband frequency: 1805 to 1880 MHz) and second elastic wave filter 204 is PCS (passband frequency: 1930 to 1990 MHz) can be produced in the following specifications.

(First Elastic Wave Filter 203)
The number of comb electrodes of IDT 31f/IDT 31d/IDT 31b/IDT 31a/IDT 31c/IDT 31e/IDT 31g: 56/39/58/36/58/39/56
Electrode finger intersection width: 65.3 μm
Duty ratio: 0.55
Electrode thickness: 160 nm
The number of electrodes of reflector 35: 30 electrodes
(Second Elastic Wave Filter 204)
The number of comb electrodes of IDT 32f/IDT 32d/IDT 32b/IDT 32a/IDT 32c/IDT 32e/IDT 32g: 30/63/34/32/34/63/30
Electrode finger intersection width: 45.0 μm
Duty ratio: 0.55
Electrode thickness: 160 nm
The number of electrodes of reflector 35: 50 electrodes
(First One-Terminal-Pair Elastic Wave Resonator 12)
The number of comb electrodes of IDT: 165
Electrode finger intersection width: 110 μm
Duty ratio: 0.55
Electrode thickness: 160 nm
(First One-Terminal-Pair Elastic Wave Resonator 13)
The number of comb electrodes of IDT: 160
Electrode finger intersection width: 45 μm
Duty ratio: 0.55
Electrode thickness: 160 nm
(Second One-Terminal-Pair Elastic Wave Resonator 14)
The number of comb electrodes of IDT: 165
Electrode finger intersection width: 110 μm
Duty ratio: 0.55
Electrode thickness: 160 nm
(Second One-Terminal-Pair Elastic Wave Resonator 15)
The number of comb electrodes of IDT: 160
Electrode finger intersection width: 45 μm
Duty ratio: 0.55
Electrode thickness: 160 nm
(Third One-Terminal-Pair Elastic Wave Resonator 16)
The number of comb electrodes of IDT: 160
Electrode finger intersection width: 75 μm
Duty ratio: 0.55
Electrode thickness: 160 nm
(Third One-Terminal-Pair Elastic Wave Resonator 17)
The number of comb electrodes of IDT: 120
Electrode finger intersection width: 65 μm
Duty ratio: 0.55
Electrode thickness: 160 nm
Fourth One-Terminal-Pair Elastic Wave Resonator 18)
The number of comb electrodes of IDT: 160
Electrode finger intersection width: 75 μm
Duty ratio: 0.55
Electrode thickness: 160 nm
(Fourth One-Terminal-Pair Elastic Wave Resonator 19)
The number of comb electrodes of IDT: 120
Electrode finger intersection width: 65 μm
Duty ratio: 0.55
Electrode thickness: 160 nm The transfer route from unbalanced terminal 5 to balanced terminal 7 in first elastic wave filter 203 is normal phase connection, while the transfer route of second elastic wave filter 204 from unbalanced terminal 6 to balanced terminal 7 is reversed phase connection. Furthermore, the transfer route from unbalanced terminal 5 to balanced terminal 8 in first elastic wave filter 203 is reversed phase connection, while the transfer route from unbalanced terminal 6 to balanced terminal 8 in second elastic wave filter 204 is normal phase connection. In this way, a branching filter is configured by carrying out connection to a common balanced terminal in reversed phase relation, an effect of improving an attenuation amount of frequency corresponding to the frequency of the passband of the counterpart is generated.

Figure 3A:
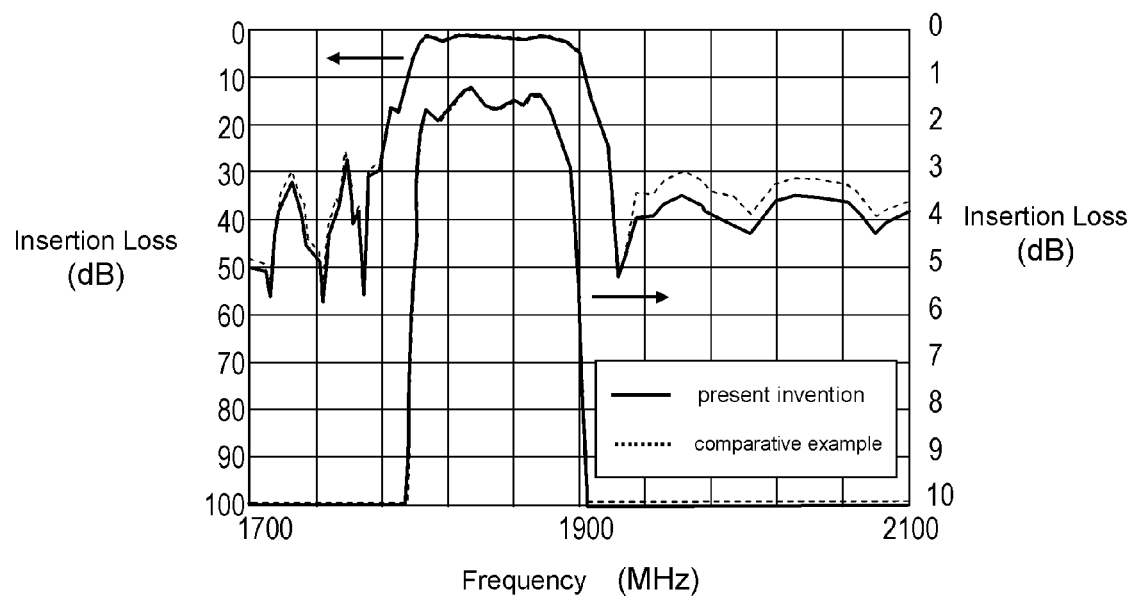
FIG. 3A is a passing characteristic diagram of a low band side filter of the elastic wave device according to the second exemplary embodiment of the present invention.
Figure 3B:
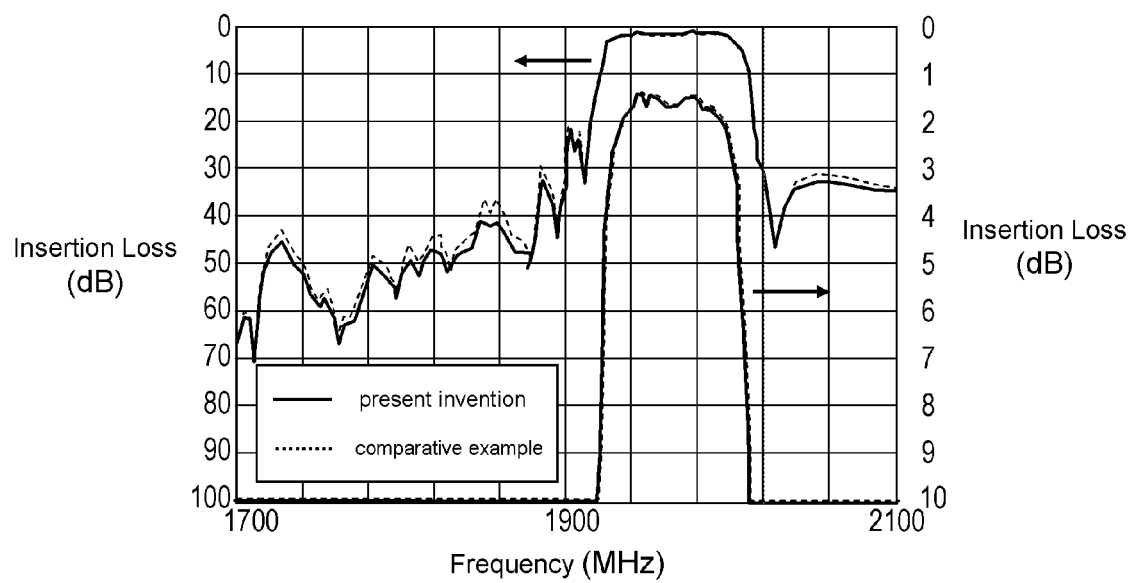
FIG. 3B is a passing characteristic diagram of a high band side filter of the elastic wave device according to the second exemplary embodiment of the present invention.

FIG. 3A is a passing characteristic diagram of a low band side filter of elastic wave device 201. FIG. 3B is a passing characteristic diagram of a high band side filter of elastic wave device 201. FIGS. 3A and 3B show the same properties with the unit of the Y axis changed. A scale on the left side is shown by a unit of 10 dB, and a scale on the right side is shown by a unit of 1 dB. FIGS. 3A and 3B also show a conventional configuration (comparative example) in which a first elastic wave filter (a low band side filter) and a second elastic wave filter (a high band side filter) are connected to a common terminal in the same phase relation. In the comparative example, IDT 32d, IDT 32a, and IDT 32e of second elastic wave filter 204 (a high band side filter) are reversed in the up-and-down direction, and the phase relation is reversed such that it is in the same phase relation with first elastic wave filter 203 (low band side filter), and the transfer route from unbalanced terminal 5 to balanced terminal 7 in first elastic wave filter 203 is normal phase connection, and the transfer route from unbalanced terminal 6 to balanced terminal 7 in second elastic wave filter 204 is normal phase connection. Furthermore, the transfer route from unbalanced terminal 5 to balanced terminal 8 in first elastic wave filter 203 is reversed phase connection, while the transfer route from unbalanced terminal 6 to balanced terminal 8 in second elastic wave filter 204 is reversed phase connection. The other configurations including the number of electrode fingers, pitch of the electrode fingers, and the duty ratio are the same. As is apparent from FIGS. 3A and 3B, in elastic wave device 201, the insertion loss is small and the attenuation amount of the counterpart is improved.

In this exemplary embodiment, the passband (first passband) of first elastic wave filter 203 is 1.805 GHz to 1.880 GHz, and the passband (second passband) of second elastic wave filter 204 is 1.930 GHz to 1.990 GH.

The antiresonance frequencies of first one-terminal-pair elastic wave resonators 12 and 13 and second one-terminal-pair elastic wave resonators 14 and 15 are 1916 MHz, 1920 MHz, 1916 MHz, and 1920 MHz, respectively, and are set out of the high band side of the first passband, and out of the low side band of the second passband. With this configuration, the first elastic wave filter can be made to have high impedance as the impedance in the second passband and can shared and connected to a balanced terminal, thus enabling insertion loss of the second filter to be reduced. Furthermore, in the passing characteristics from unbalanced terminal 5 to balanced terminals 7 and 8, the attenuation characteristics in the second passband frequency become excellent.

Furthermore, antiresonant frequencies of third one-terminal-pair elastic wave resonators 16 and 17 and fourth one-terminal-pair elastic wave resonators 18 and 19 are set to 2007 MHz, 2020 MHz, 2007 MHz, and 2020 MHz, respectively, which are out of the band at the high band side of the second passband. With this configuration, it is possible to increase the attenuation amount at the high band side of the second filter. In addition, by adjusting the frequencies and capacitance of the resonator of first one-terminal-pair elastic wave resonators 12 and 13, and fourth one-terminal-pair elastic wave resonators 18 and 19, the degree of balance can be improved.

Furthermore, a one-terminal-pair elastic wave resonator may be provided between first elastic wave filter 203 and unbalanced terminal 5, and a one-terminal-pair elastic wave resonator may be provided between second elastic wave filter 204 and unbalanced terminal 6. With such a configuration, the attenuation characteristics can be further improved.

Third Exemplary Embodiment

In the first and second exemplary embodiments, a filter part includes one elastic wave filter, but it may include a plurality of elastic wave filters. In this exemplary embodiment, a first filter part and a second filter part have a configuration in which longitudinally coupled elastic wave filters each having three IDTs are connected in parallel.

Figure 4:
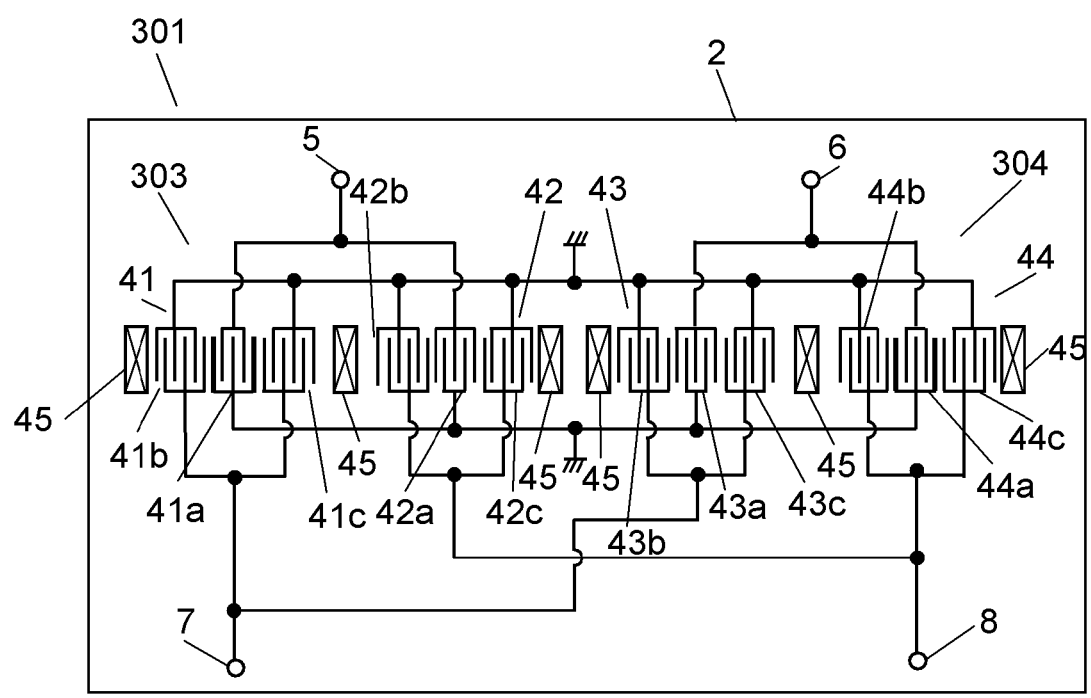
FIG. 4 is a schematic plan view of an elastic wave device according to a third exemplary embodiment of the present invention.

FIG. 4 is a schematic plan view of elastic wave device 301 according to a third exemplary embodiment of the present invention. Elastic wave device 301 includes first filter part 303 having a first passband that has a relatively low frequency and second filter part 304 having a second passband that has a relatively high frequency on piezoelectric substrate 2.

First filter part 303 is formed by connecting two longitudinally coupled elastic wave filters 41 and 42 in parallel. Longitudinally coupled elastic wave filter 41 includes IDTs 41a, 41b, and 41c. Two reflectors 45 sandwich IDTs 41a, 41b, and 41c. Longitudinally coupled elastic wave filter 42 includes IDTs 42a, 42b, and 42c. Two reflectors 45 sandwich IDTs 42a, 42b, and 42c.

Second filter part 304 is formed by connecting two longitudinally coupled elastic wave filters 43 and 44 in parallel. Longitudinally coupled elastic wave filter 43 includes IDTs 43a, 43b, and 43c. Two reflectors 45 sandwich IDTs 43a, 43b, and 43c. Longitudinally coupled elastic wave filter 44 includes IDTs 44a, 44b, and 44c. Two reflectors 45 sandwich IDTs 44a, 44b, and 44c.

One of comb electrodes of each of IDTs 41a and 42a in the center of longitudinally coupled elastic wave filters 41 and 42 constituting first filter part 303 is connected to first unbalanced terminal 5, and the other of the comb electrodes is connected to ground. IDT 41b and IDT 41c of longitudinally coupled elastic wave filter 41 are disposed adjacent to IDT 41a so as to sandwich IDT 41a. One of comb electrodes of each of IDTs 41b and 41c is connected to first balanced terminal 7, and the other of the comb electrodes is connected to ground. IDT 42b and IDT 42c of longitudinally coupled elastic wave filter 42 are disposed adjacent to IDT 42a so as to sandwich IDT 42a. One of the comb electrodes of each of IDTs 42b and 42c is connected to second balanced terminal 8, and the other of the comb electrodes is connected to ground. A phase relation in the transfer route from an input IDT to an output IDT in longitudinally coupled elastic wave filters 41 and 42 is reversed phase relation, and first filter part 303 has an unbalance/balance conversion function. That is to say, in FIG. 4, longitudinally coupled elastic wave filter 41 is connected in normal phase, and longitudinally coupled elastic wave filter 42 is connected in reversed phase.

One of the comb electrodes of each of IDTs 43a and 44a in the center of longitudinally coupled elastic wave filters 43 and 44 constituting second filter part 304 is connected to second unbalanced terminal 6. The other of the comb electrodes is connected to ground. IDT 43b and IDT 43c of longitudinally coupled elastic wave filter 43 are disposed adjacent to IDT 43a so as to sandwich IDT 43a. One of the comb electrodes of each of IDTs 43b and 43c is connected to first balanced terminal 7, and the other of the comb electrodes is connected to ground. IDT 44b and IDT 44c of longitudinally coupled elastic wave filter 44 are disposed adjacent to IDT 44a so as to sandwich IDT 44a. One of the comb electrodes of each of IDTs 44b and 44c is connected to second balanced terminal 8, and the other of the comb electrodes is connected to ground. A phase relation in the transfer route from the input IDT to the output IDT in longitudinally coupled elastic wave filters 43 and 44 is in a reversed phase relation, and second filter part 304 has an unbalance/balance conversion function. In other words, in FIG. 4, longitudinally coupled elastic wave filter 43 is connected in reversed phase, and longitudinally coupled elastic wave filter 44 is connected in normal phase.

The transfer route from unbalanced terminal 5 to balanced terminal 7 is in normal phase connection by longitudinally coupled elastic wave filter 41, while the transfer route from unbalanced terminal 6 to balanced terminal 7 is in reversed phase connection by longitudinally coupled elastic wave filter 43. Therefore, the phase relation of the transfer route from unbalanced terminal 5 to balanced terminal 7 and the phase relation of the transfer route from unbalanced terminal 6 to balanced terminal 7 are opposite to each other. Furthermore, the transfer route from unbalanced terminal 5 to balanced terminal 8 is in reversed phase connection by longitudinally coupled elastic wave filter 43, while the transfer route from unbalanced terminal 6 to balanced terminal 8 is in normal phase connection by longitudinally coupled elastic wave filter 44. Therefore, the phase relation of the transfer route from unbalanced terminal 5 to balanced terminal 8 and the phase relation of the route from unbalanced terminal 6 to balanced terminal 8 are opposite to each other.

Thus, by connecting first filter part 303 and filter part 304 in an opposite phase relation, an attenuation amount of frequency corresponding to a frequency of the passband of a counterpart can be improved. In more detail, it is possible to obtain a filter in which the insertion loss of the first passband is small and the attenuation amount of the frequency corresponding to that of the second passband is excellent in the low band side filter characteristics. Furthermore, it is possible to obtain a filter in which the insertion loss of the second passband is improved and the attenuation amount of the frequency corresponding to that of the first passband is improved in high band side filter characteristics. By the improvement of the attenuation amount, isolation characteristics in the first passband frequency and the second passband frequency become excellent.

In this exemplary embodiment, the number of comb electrodes connected to ground among the comb electrodes in a place in which an input IDT and an output IDT are adjacent to each other is described below. The total of the number of the comb electrodes connected to ground that exists in a route from unbalanced terminal 5 to balanced terminal 7 and a route from unbalanced terminal 6 to balanced terminal 7 is equal to the total of the number of the comb electrodes connected to ground that exists in a route from unbalanced terminal 5 to balanced terminal 8 and a route from unbalanced terminal 6 to balanced terminal 8. In more detail, among comb electrodes nearest to the IDT of the counterpart in the route from unbalanced terminal 5 to balanced terminal 7 and the route from unbalanced terminal 6 to balanced terminal 8, comb electrodes connected to ground include two comb electrodes in total, including one comb electrode between IDT 41a and IDT 41b, one comb electrode between IDT 41a and IDT 41c, no comb electrode between IDT 43a and IDT 43b, and no comb electrode between IDT 43a and IDT 43c. The comb electrodes connected to ground in adjacent IDTs in the route between unbalanced terminal 5 and balanced terminal 8 and in the route between unbalanced terminal 6 and balanced terminal 8 include two comb electrodes in total, including no electrode between IDT 42a and IDT 42b, no electrode between IDT 42a and IDT 42c, one electrode between IDT 44a and IDT 44b, and one electrode between IDT 44a and IDT 44c. In FIG. 4, the above-mentioned comb electrodes are shown by a solid line.

With this configuration, parasitic capacitance generated among IDTs in the filter part, which is generated among first balanced terminal 7, first unbalanced terminal 5, and second unbalanced terminal 6, and parasitic capacitance among IDTs in the filter part, which is generated among second balanced terminal 8, first unbalanced terminal 5, and second unbalanced terminal 6 are substantially the same as each other. In addition, an average of a distance between the centers of the input IDT and the output IDT is the same in the route from first balanced terminal 7 to first unbalanced terminal 5 and second unbalanced terminal 6 and in the route from second balanced terminal 8 to first unbalanced terminal 5 and second unbalanced terminal 6. Consequently, an excellent degree of balance required for a filter having an unbalance-balance function can be achieved.

Furthermore, when the number of comb electrodes of at least one IDT of IDT 41b, IDT 41c, IDT 42b, IDT 42c, IDT 43b, IDT 43c, IDT 44b, and IDT 44c is allowed to be different from the number of comb electrodes of the other IDTs, the degree of balance may be improved. At this time, when one comb electrode may be added or removed at the side near reflector 45, the degree of balance can be improved.

Fourth Exemplary Embodiment

Figure 5:
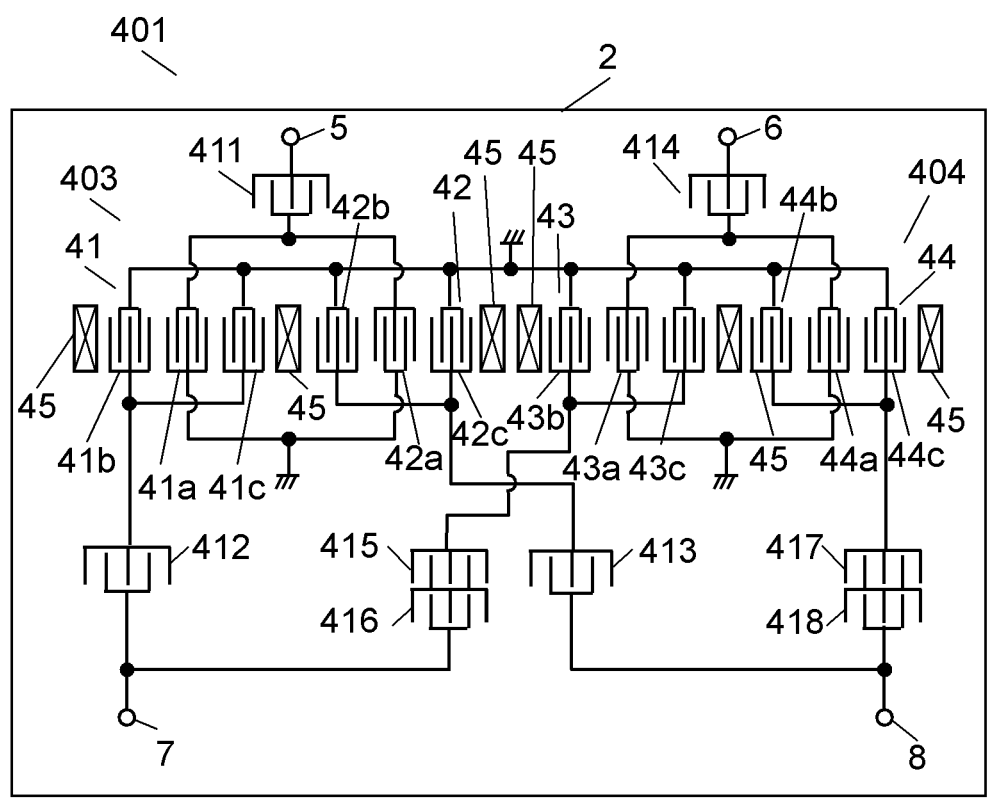
FIG. 5 is a schematic plan view of an elastic wave device according to a fourth exemplary embodiment of the present invention.
Figure 6:
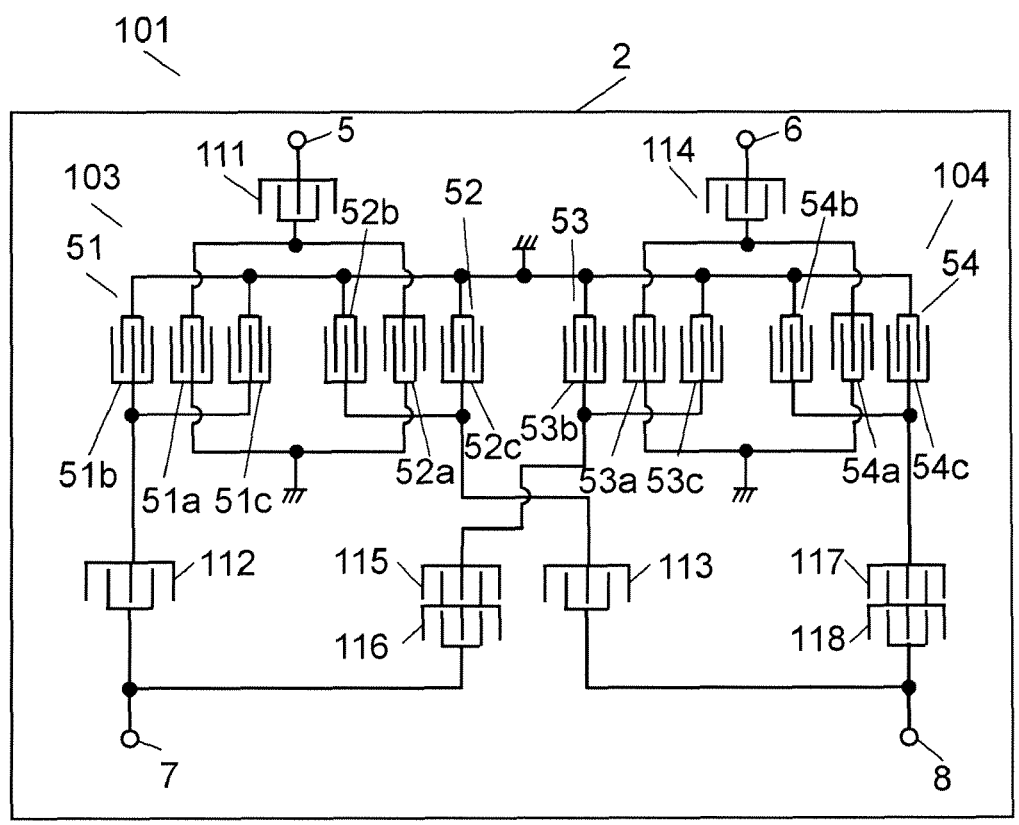
FIG. 6 is a schematic plan view of a conventional elastic wave device.

FIG. 5 is a schematic plan view of elastic wave device 401 according to a fourth exemplary embodiment of the present invention. Elastic wave device 401 includes first filter part 403 having a first passband whose frequency is relatively low and second filter part 404 having a second passband whose frequency is relatively high on piezoelectric substrate 2. Since configurations of filter parts 403 and 404 are basically the same as those of filter parts 303 and 304 shown in the third exemplary embodiment, the detail description thereof is omitted herein.

This exemplary embodiment is different from the third exemplary embodiment mainly in that one-terminal-pair elastic wave resonators 411 to 418 are connected at an input side and an output side of a first filter part or a second filter part.

The resonance frequency of one-terminal-pair elastic wave resonator 411 is set within the first passband frequency, and the antiresonance frequency is set to be higher than the first passband frequency. One-terminal-pair elastic wave resonator 411 is connected in series with first unbalanced terminal 5 and first filter part 403. With this configuration, attenuation characteristics can be improved in a frequency higher than that of the first passband with the filter characteristics of the low band side having a first passband whose frequency is relatively low.

The resonance frequency of one-terminal-pair elastic wave resonator 414 is set within the second passband frequency, and the antiresonance frequency is set to be higher than the second passband frequency. One-terminal-pair elastic wave resonator 414 is connected in series with second unbalanced terminal 6 and second filter part 404. With this configuration, attenuation characteristics can be improved in a frequency higher than that of the second passband with the filter characteristics of the high band side having a second passband whose frequency is relatively high.

The antiresonance frequency of one-terminal-pair elastic wave resonator 412 is set at a frequency between the first passband frequency and the second passing frequency. One-terminal-pair elastic wave resonator 412 is connected in series between first longitudinally coupled elastic wave filter 41 and first balanced terminal 7 in the first filter part.

The antiresonance frequency of one-terminal-pair elastic wave resonator 413 is set to a frequency between the first passband frequency and the second passing frequency. One-terminal-pair elastic wave resonator 413 is connected in series between second longitudinally coupled elastic wave filter 42 and second balanced terminal 8 in the first filter part. With this configuration, when the first filter part and the second filter part are connected to each other by balanced terminals 7 and 8, it possible to prevent insertion loss of the filter characteristics of the high band side having relatively high frequency.

Antiresonance frequencies of one-terminal-pair elastic wave resonator 415 and one-terminal-pair elastic wave resonator 416 are set to be higher than the second passband frequency. One-terminal-pair elastic wave resonator 415 and one-terminal-pair elastic wave resonator 416 are longitudinally connected to each other, and connected in series between first balanced terminal 7 and first longitudinally coupled elastic wave filter 43 of the second filter part.

Antiresonance frequencies of one-terminal-pair elastic wave resonator 417 and one-terminal-pair elastic wave resonator 418 are set to be higher than the second passband frequency. One-terminal-pair elastic wave resonator 417 and one-terminal-pair elastic wave resonator 418 are longitudinally connected to each other, and connected in series between second balanced terminal 8 and second longitudinally coupled elastic wave filter 44 of the second filter part. This configuration makes it possible to improve an attenuation amount in the filter characteristics having the second passband with a relatively high frequency.

One-terminal-pair elastic wave resonators 412 and 413 do not necessarily have the same frequency and electrostatic capacitance. Also, one-terminal-pair elastic wave resonators 415, 416, 417, and 418 do not necessarily have the same frequency and electrostatic capacitance. On the contrary, when they are allowed to be different from each other, the degree of balance or the attenuation amount may be improved.

The above-mentioned elastic wave devices 1, 201, 301, and 401 may not be limited and may be a SH (Shear Horizontal) wave type surface wave device, a Lamb wave type surface wave device, a Rayleigh wave type surface wave device, a SH wave type boundary wave device, and a Rayleigh wave type boundary wave device.

Piezoelectric substrate 2 may not be limited and may be formed of any of lithium tantalate, lithium niobate, quartz, lithium tetraborate.

With the above-mentioned configuration, in elastic wave devices 1, 201, 301, and 401 of the exemplary embodiments, the insertion loss can be reduced, and the attenuation amount in the passband of the counterpart can be efficiently secured. As a result, excellent isolation characteristics can be obtained. Therefore, excellent electric characteristics can be obtained.

INDUSTRIAL APPLICABILITY

An elastic wave element has an effect capable of reducing insertion loss and improving an attenuation amount, and is applied to electronic devices such as a portable telephone.

REFERENCE MARKS IN THE DRAWINGS 1, 101, 201, 301, 401 elastic wave device
103, 104, 303, 304, 403, 404 filter part
5, 6 unbalanced terminal
7, 8 balanced terminal
41, 42, 43, 44, 51, 52, 53, 54 longitudinally coupled elastic wave filter (longitudinally coupled elastic wave resonator)
3, 203 first elastic wave filter
4, 204 second elastic wave filter
12, 13, 14, 15, 16, 17, 18, 19, 111, 112, 113, 114, 115, 116, 117, 118, 411, 412, 413, 414, 415, 416, 417, 418 one-terminal-pair elastic wave resonator
21a, 21b, 21c, 21d, 21e, 21f, 21g, 22a, 22b, 22c, 22d, 22e, 22f, 22g, 31a, 31b, 31c, 31d, 31e, 31f, 31g, 32a, 32b, 32c, 32d, 32e, 32f, 32g, 41a, 41b, 41c, 42a, 42b, 42c, 43a, 43b, 43c, 44a, 44b, 44c, 51a, 51b, 51c, 52a, 52b, 52c, 53a, 53b, 53c, 54a, 54b, 54c IDT
25, 35, 45 reflector

The invention claimed is:

1. An elastic wave device comprising:
a first unbalanced terminal and a second unbalanced terminal;
a first balanced terminal and a second balanced terminal;
a first filter having a first passband and an unbalance/balance conversion function, the first filter having an input electrically connected to the first unbalanced terminal and an output electrically connected to the first balanced terminal and to the second balanced terminal; and
a second filter having a second passband with a frequency higher than a frequency of the first passband and an unbalance/balance conversion function, the second filter having an input electrically connected to the second unbalanced terminal and an output electrically connected to the first balanced terminal and to the second balanced terminal, a phase of an electric signal from the first unbalanced terminal to the first balanced terminal in the first filter and a phase of an electric signal from the second unbalanced terminal to the first balanced terminal in the second filter being different from each other, and a phase of the electric signal from the first unbalanced terminal to the second balanced terminal in the first filter and a phase of the electric signal from the second unbalanced terminal to the second balanced terminal in the second filter being different from each other.

2. The elastic wave device of claim 1 wherein each of the first filter and the second filter further includes a plurality of longitudinally coupled elastic wave resonators connected in parallel with one another.

3. The elastic wave device of claim 1 wherein at least one of the first filter and the second filter includes seven Inter Digital Transducers (IDTs).

4. The elastic wave device of claim 1 wherein the first filter and the second filter each includes an elastic wave filter.

5. The elastic wave device of claim 1 wherein the first filter includes a first longitudinally coupled elastic wave resonator having a first Inter Digital Transducer (IDT) with comb electrodes electrically connected to the first unbalanced terminal, a second IDT adjacent to the first IDT with comb electrodes electrically connected to the first balanced terminal, and a third IDT adjacent to the first IDT with comb electrodes electrically connected to the second balanced terminal.

6. The elastic wave device of claim 5 wherein the second filter includes a second longitudinally coupled elastic wave resonator including a fourth IDT having comb electrodes electrically connected to the second unbalanced terminal, a fifth IDT disposed adjacent to the fourth IDT and having comb electrodes electrically connected to the first balanced terminal, and a sixth IDT adjacent to the fourth IDT and having comb electrodes electrically connected to the second balanced terminal.

7. The elastic wave device of claim 6 wherein each of the first through sixth IDTs includes electrode fingers and a total number of the electrode fingers connected to ground in the second IDT and the fifth IDT is equal to a total number of the electrode fingers connected to ground in the third IDT and the sixth IDT.

8. The elastic wave device of claim 1 wherein the first filter is sandwiched by a first reflector and a second reflector.

9. The elastic wave device of claim 8 wherein the second filter is sandwiched by a third reflector and a fourth reflector.

10. The elastic wave device of claim 9 wherein the first filter and the second filter each includes Inter Digital Transducers (IDTs) having comb electrodes, a number of the comb electrodes of a first IDT adjacent to any of the first to fourth reflectors and a number of the comb electrodes of a second IDT adjacent to the first IDT being different from each other.

11. An elastic wave device comprising:
a first unbalanced terminal and a second unbalanced terminal;
a first balanced terminal and a second balanced terminal;
a first filter having a first passband and including first to seventh Inter Digital Transducers (IDTs) disposed adjacent one another in ascending numerical order, the second IDT, the fourth IDT, and the sixth IDT being electrically connected to the first unbalanced terminal, the first IDT and the third IDT being electrically connected to the first balanced terminal, and the fifth IDT and the seventh IDT being electrically connected to the second balanced terminal; and a second filter having a second passband with a frequency higher than a frequency of the first passband and including eighth to fourteenth IDTs disposed adjacent one another in ascending numerical order, the ninth IDT, the eleventh IDT, and the thirteenth IDT being connected to the second unbalanced terminal, the eighth IDT and the tenth IDT being electrically connected to the first balanced terminal, and the twelfth IDT and the fourteenth IDT being electrically connected to the second balanced terminal, a phase of an electric signal between the first unbalanced terminal and the first balanced terminal and a phase of the electric signal between the first unbalanced terminal and the second balanced terminal being different from each other by 180°, and a phase of an electric signal between the second unbalanced terminal and the first balanced terminal and a phase of the electric signal between the second unbalanced terminal and the second balanced terminal being different from each other by 180°.

12. The elastic wave device of claim 11 wherein each of the first through fourteenth IDTs includes comb electrodes and the comb electrodes of the second IDT, the sixth IDT, the ninth IDT, and the thirteenth IDT are odd in number.

13. The elastic wave device of claim 11 wherein the first filter is sandwiched by a first reflector and a second reflector.

14. The elastic wave device of claim 13 wherein the second filter is sandwiched by a third reflector and a fourth reflector.

15. The elastic wave device of claim 14 wherein each of the first to fourteenth IDTs includes comb electrodes, a number of the comb electrodes of IDTs adjacent to the first to fourth reflectors and a number of the comb electrodes of IDTs adjacent to the IDTs adjacent to the first to fourth reflectors being different from each other.

16. The elastic wave device of claim 11 wherein each of the first through fourteenth IDTs includes comb electrodes and a total number of the comb electrodes connected to ground in the first through fourth IDTs and the eighth through eleventh IDTs is equal to a total number of the comb electrodes connected to ground in the fourth through seventh IDTs and the eleventh through fourteenth IDTs.

17. The elastic wave device of claim 11 wherein each of the first through fourteenth IDTs includes comb electrodes and a number of the comb electrodes included in the second IDT is equal to a number of the comb electrodes included in the sixth IDT, and a number of the comb electrodes included in the third IDT is equal to a number of the comb electrodes included in the fifth IDT.

18. The elastic wave device of claim 17 wherein a number of the comb electrodes included in the ninth IDT is equal to a number of the comb electrodes included in the thirteenth IDT, and a number of the comb electrodes included in the tenth IDT is equal to a number of the comb electrodes included in the twelfth IDT.

19. The elastic wave device of claim 18 wherein a number of the comb electrodes included in the second IDT is different from a number of the comb electrodes included in the ninth IDT.

20. The elastic wave device of claim 19 wherein a number of the comb electrodes included in the third IDT is different from a number of the comb electrodes included in the tenth IDT.

21. The elastic wave device of claim 11 wherein the first IDT and the second IDT, the second IDT and the third IDT, and the third IDT and the fourth IDT are connected in normal phase connection, and the fourth IDT and the fifth IDT, the fifth IDT and the sixth IDT, and the sixth IDT and the seventh IDT are connected in reversed phase connection.

22. The elastic wave device of claim 21 wherein the eighth IDT and the ninth IDT, the ninth IDT and the tenth IDT, and the tenth IDT and the eleventh IDT are connected in reversed phase connection, and the eleventh IDT and the twelfth IDT, the twelfth IDT and the thirteenth IDT, and the thirteenth IDT and the fourteenth IDT are connected in normal phase connection.

23. The elastic wave device of claim 11 wherein each of the first through fourteenth IDTs includes comb electrodes and one of adjacent comb electrodes in pairs of adjacent IDTs in the first through fourth IDTs is connected to a signal line and the other adjacent comb electrode is connected to ground, and both of adjacent comb electrodes in pairs of adjacent IDTs in the fourth through seventh IDTs are connected to one of a signal line and ground.

24. The elastic wave device of claim 23 wherein both of adjacent comb electrodes in pairs of adjacent IDTs in the eighth through eleventh IDTs are connected to one of a signal line and ground, and one of adjacent comb electrodes in pairs of adjacent IDTs in the eleventh through fourteenth IDTs is connected to the signal line and the other of the adjacent comb electrodes is connected to ground.

25. An elastic wave device comprising:
a first unbalanced terminal and a second unbalanced terminal;
a first balanced terminal and a second balanced terminal;
a first filter having an input electrically connected to the first unbalanced terminal and an output electrically connected to the first balanced terminal and to the second balanced terminal, the first filter including a first elastic wave filter and a second elastic wave filter connected in parallel, the first elastic wave filter and the second elastic wave filter having equal resonant frequencies and having phases that differ from each other by 180°; and
a second filter having an input electrically connected to the second unbalanced terminal, an output electrically connected to the first balanced terminal and to the second balanced terminal, and having a passband frequency that is different from that of the first filter, the second filter including a third elastic wave filter and a fourth elastic wave filter connected in parallel, the third elastic wave filter and the fourth elastic wave filter having equal resonant frequencies and having phases that differ from each other by 180°, a phase of an electrical signal from the first unbalanced terminal to the first balanced terminal in the first filter and a phase of an electrical signal from the second unbalanced terminal to the first balanced terminal in the second filter being opposite to each other, and a phase of the electrical signal from the first unbalanced terminal to the second balanced terminal in the first filter and a phase of the electrical signal from the second unbalanced terminal to the second balanced terminal in the second filter being opposite to each other.

26. The elastic wave device of claim 25 wherein the first elastic wave filter, the second elastic wave filter, the third elastic wave filter, and the fourth elastic wave filters include Inter Digital Transducers (IDTs) having comb electrodes.

27. The elastic wave device of claim 25 wherein the first filter is sandwiched by a first reflector and a second reflector.

28. The elastic wave device of claim 27 wherein the second filter is sandwiched by a third reflector and a fourth reflector.

29. The elastic wave device of claim 25 wherein the first filter and the second filter further include longitudinally coupled elastic wave resonators connected in parallel with each other.

30. An elastic wave device comprising:
a first unbalanced terminal and a second unbalanced terminal;
a first balanced terminal and a second balanced terminal;
a first filter having a first passband and an unbalance/balance conversion function, the first filter having an input electrically connected to the first unbalanced terminal, an output electrically connected to the first balanced terminal and to the second balanced terminal, and a first longitudinally coupled elastic wave resonator including a plurality of Inter Digital Transducers (IDTs); and
a second filter having a second passband that is different from the first passband and having an unbalance/balance conversion function, the second filter having an input electrically connected to the second unbalanced terminal, an output electrically connected to the first balanced terminal and to the second balanced terminal, and a second longitudinally coupled elastic wave resonator including a plurality of IDTs, a type of connection from the first unbalanced terminal to the first balanced terminal via the first filter being one of a normal phase connection and a reversed phase connection and being different from a type of connection from the second unbalanced terminal to the first balanced terminal via the second filter, a type of connection from the first unbalanced terminal to the second balanced terminal via the first filter being one of a normal phase connection and a reversed phase connection and being different from a type of connection from the second unbalanced terminal to the second balanced terminal via the second filter.

\* \* \* \* \*

UNITED STATES PATENT AND TRADEMARK OFFICE
CERTIFICATE OF CORRECTION

PATENT NO. : 9,172,350 B2  Page 1 of 1
APPLICATION NO. : 13/701417
DATED : October 27, 2015
INVENTOR(S) : Kazunori Nishimura et al.

It is certified that error appears in the above-identified patent and that said Letters Patent is hereby corrected as shown below:

In the Specification:

Column 1, insert -- RELATED APPLICATIONS
This application is the U.S. National Phase under 35 U.S.C. § 371 of International Application No. PCT/JP2012/001546, filed on March 7, 2012, which in turn claims the benefit of Japanese Application No. 2011-051192, filed on March 9, 2011, the disclosures of which Applications are incorporated by reference herein. -- after the Title and before "TECHNICAL FIELD".

Column 5, Line 34, delete "a terminal of".

Column 12, Line 35, delete "passing" and insert -- passband --.

Column 12, Line 41, delete "passing" and insert -- passband --.

Signed and Sealed this
First Day of March, 2016

Michelle K. Lee
*Director of the United States Patent and Trademark Office*